United States Patent [19]
Schimpe

[11] Patent Number: 5,504,827
[45] Date of Patent: Apr. 2, 1996

[54] PROGRAMMABLE OPTICAL FILTER AND OPTICAL CIRCUIT ARRANGEMENT

[75] Inventor: Robert Schimpe, Riemerling, Germany

[73] Assignee: Siemens Aktiengesellschaft, Munich, Germany

[21] Appl. No.: 287,236

[22] Filed: Aug. 8, 1994

[30] Foreign Application Priority Data

Aug. 6, 1993 [DE] Germany .................. 43 26 522.7

[51] Int. Cl.⁶ .............................................. G02B 6/293
[52] U.S. Cl. .............................. 385/24; 359/320; 385/4; 385/14; 385/17; 385/27
[58] Field of Search .................... 385/1–4, 8, 9, 385/14, 15, 16, 17, 24, 27; 359/245, 308, 315, 320

[56] References Cited

U.S. PATENT DOCUMENTS

| | | | |
|---|---|---|---|
| 4,699,466 | 10/1987 | Brandstetter et al. | 359/308 |
| 4,824,200 | 4/1989 | Isono et al. | 385/24 |
| 5,339,157 | 8/1994 | Glance et al. | 385/24 |
| 5,373,516 | 12/1994 | Glance et al. | 385/17 X |

OTHER PUBLICATIONS

Soole et al, "Monolithic WDM Sources and Detectors for the Long WavelLength Fiber Band Based on an InP Grating Multiplexer/Demultiplexer", Paper OTA2.5, *IEEE Lasers and Electro-Optical Society*, Annual Meeting Nov. 16–19, 1992, Boston, pp. 690–691.

Liew et al, "Applications of the Acousto-Optic Tunable Filter in Local Access Networks", *Broadband (FOC/LAN)'90*, Baltimore, Sep. 1990, pp. 307–313.

Takato et al, "128-Channel Polarization-Insensitive Frequency-Selection-Switch Using High-Silica Waveguides on Si", *IEEE Photonics Technology Letters*, vol. 2, No. 6, Jun. 1990, pp. 441–443.

*Primary Examiner*—John D. Lee
*Attorney, Agent, or Firm*—Hill, Steadman & Simpson

[57] ABSTRACT

A programmable optical filter and an optical circuit arrangement using the filter has an optical demultiplexer for a spatial separation of the wavelengths from one another and a control arrangement composed of either an optical absorption modulator or an optical switch for controlled influencing of the light of the wavelength independent of other wavelengths. An optical amplifier may be arranged with each of the optical switches or absorption modulators.

20 Claims, 3 Drawing Sheets

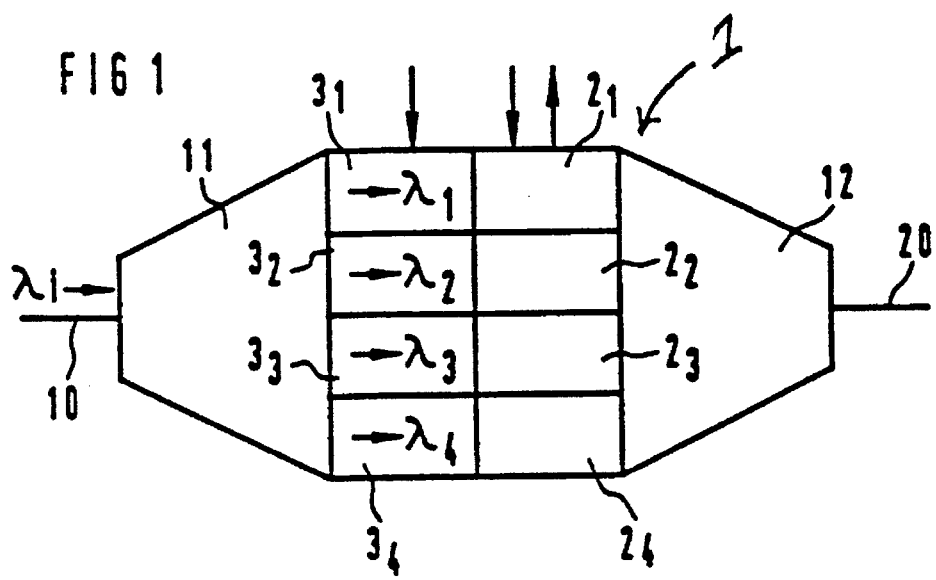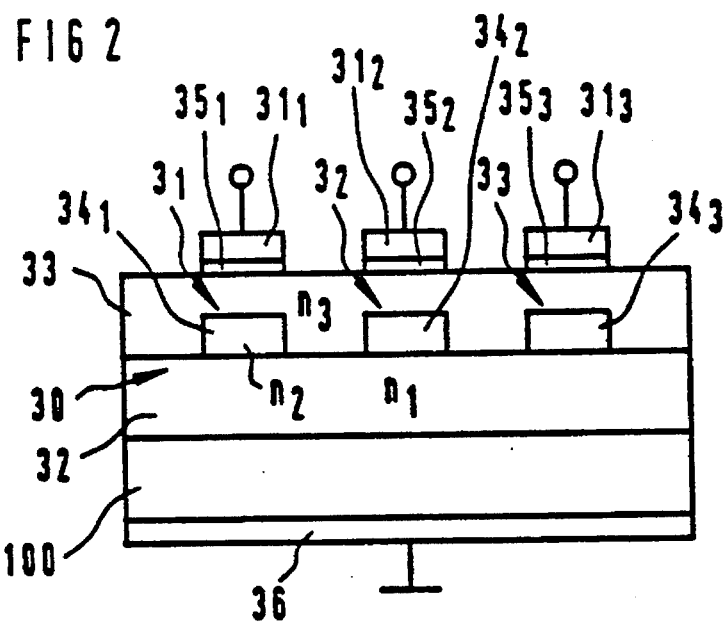

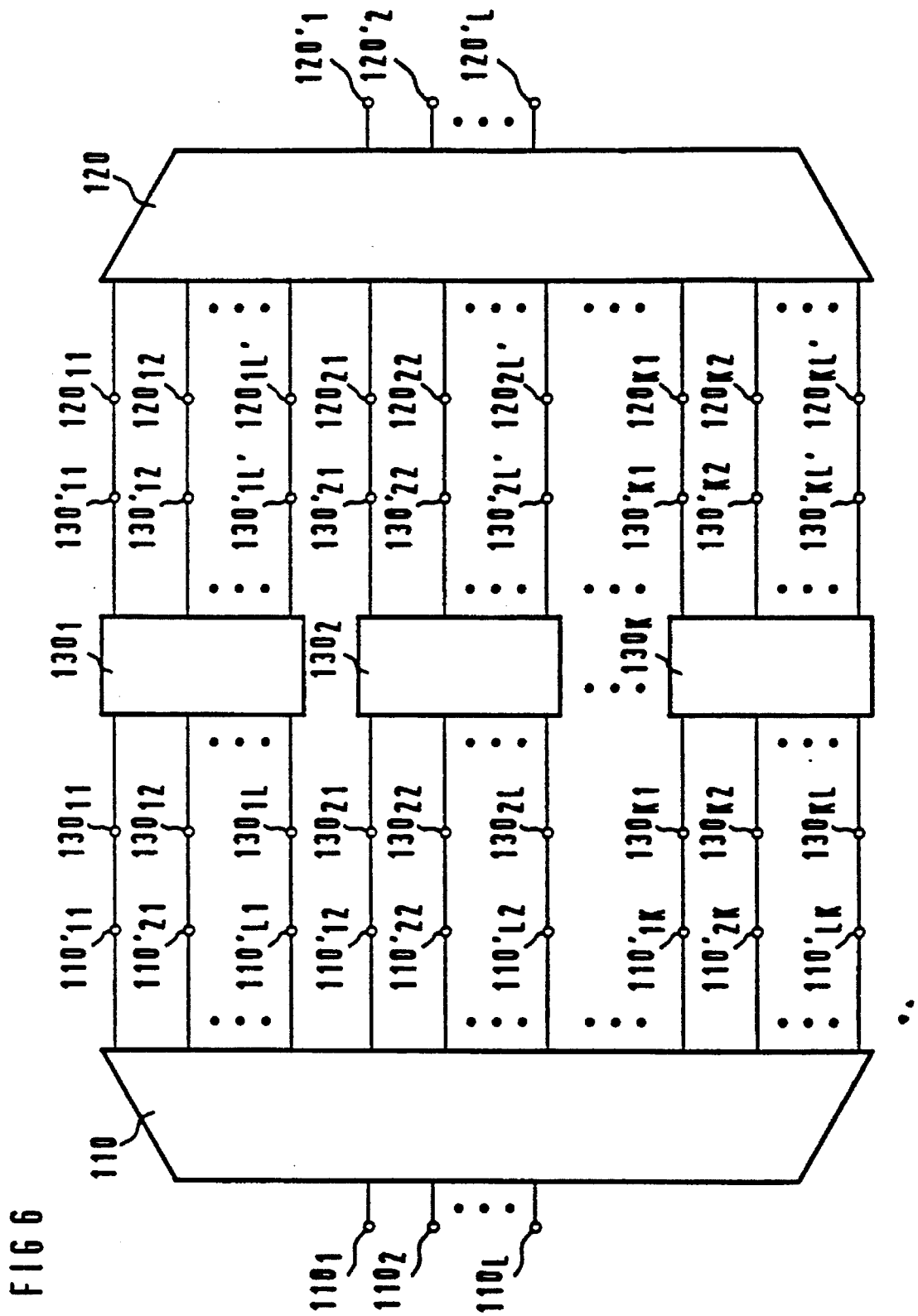

PROGRAMMABLE OPTICAL FILTER AND OPTICAL CIRCUIT ARRANGEMENT

BACKGROUND OF THE INVENTION

The present invention is directed to programmable optical filters and optical circuit arrangements.

Polarization-independent filters that are tunable and/or can simultaneously select a plurality of different wavelengths are required for optical networks having multiple services.

A programmable optical filter is disclosed in a paper by J. B. D. Soole et al, "Monolithic WDM Sources and Detectors for the Long Wavelength Fiber Band Based on an InP Grating Multiplexer/Demultiplexer", Paper OTA2.5, *IEEE Lasers and Electro-Optical Society,* Annual Meeting Nov. 16–19, 1992, Boston, pp. 690–691. This programmable optical filter is for a plurality of different optical wavelengths and the filter comprises an optical demultiplexer for the spatial separation of the wavelengths from one another and a respective controllable optical amplifier per wavelength for the controlled amplification of the light of this wavelength independent of other wavelengths, wherein the optical amplifiers are in the form of strip-like optical waveguides integrated on a substrate wherein the light waveguide can be optically intensified.

Other known filters having multiple wavelength selection usually function according to the acousto-optical principle. A rapidly-switching, polarization-dependent filter for the selection of a plurality of optical channels from a wavelength comb having channel spacings down to 1 nm is disclosed by S. C. Liew et al, "Applications of the Acousto-Optic Tunable Filter in Local Access Networks", *Broadband (FOC/LAN)* '90, Baltimore, September 1990, pp. 307–313.

Tunable filters can also be realized with a plurality of arrangements. For example, a thermally tunable polarization-independent filter for the extremely narrow 0.1 nm channel spacing in planar $SiO_2$ technology is disclosed in an article by N. Takato et al, "128-Channel Polarization-Insensitive Frequency-Selection-Switch Using High-Silica Waveguides on Si", *IEEE Photonics Technology Letters,* Vol. 2, No. 6, June 1990, pp. 441–443.

SUMMARY OF THE INVENTION

An object of the present invention is to provide a rapidly-switching, polarization-independent, programmable optical filter.

To accomplish this goal, the present invention is directed to an improvement in a programmable optical filter for a plurality of different wavelengths, which filter includes first means for the spatial separation of the wavelengths from one another and controllable means per wavelength for controlled influencing of the light of this wavelength independent of the other wavelengths. The improvements are that the controllable means for the controlling influence of the light waveguides allocated include modulator means for optical absorption modulation and/or an optical switching.

In the filter of the present invention, the first means for the spatial separation of the optical wavelengths can be a wavelength demultiplexer, for example constructed in the form of a planar spectrograph or of a phased array, for example in InP technology, in $SiO_2$ technology or Si/Ge technology. The absorption modulator or the switch of the modulator means, for example, is a directional coupler or an interferometer and can be implemented in III/V semiconductor technology on the basis of the polymer or on the basis of $LiNbO_3$. When the optical amplifiers are provided, these are also implemented in III/V semiconductor technology. The absorption modulators or switches are controlled by varying the optical refractive index by influencing the distribution of the electrical charge carriers by application of an electrical voltage, by injection of electrical current or injection of light, for example parallel or perpendicularly relative to the running direction of the light signal having said wavelength.

When optical amplifiers are employed, the amplifiers can be advantageously implemented to be optically coupled. In this case, an extremely narrow wavelength spacing can be realized in the channel selection up to and through continuous tuning of the filter on the basis of the corresponding drive of the electrodes for injecting current.

Preferably, each of the optical amplifiers comprises a common sheet waveguide integrated on the substrate, and each amplifier comprises a separate, strip-like electrode provided on the flat side of the sheet waveguide for the independent, local control of the optical amplification of the light guided in the sheet waveguide by local injection of charge carriers into the sheet waveguide. Preferably, a pin-junction or a pin-junction is provided between each electrode of the amplifier and the sheet waveguide. These embodiments can be realized both for filters having only optical amplifiers as well as for filters having controllable optical amplifiers for the controlled amplification of the light supplied to the modulator or switch or emerging therefrom with the light waveguide allocated to this modulator or switch or when the optical amplifier is arranged between the first means for the spatial separation of the wavelengths from one another and the absorption modulator or switch.

The optical wavelength emerging from the absorption modulator or switch or, respectively, optical amplifier can be combined by second means for combining these wavelengths, for example, into a common waveguide, for example an optical fiber.

Wavelength channels can also be detected. For example, an absorption modulator switch or an optical amplifier that is not being employed at the moment for transmission through the filter can be used as a photodetector given a correspondingly suitable structure, as a result whereof what is referred to as a "drop function" is obtained or realized.

Advantageous optical circuit arrangements can be advantageously realized with programmable optical filters, particularly the filters of the present invention. For example, the optical circuit arrangement in an optical cross-connect that exchanges optical channels between two data lines. This cross-connect can be realized with four programmable filters and optical power dividers. The cross-connect function is obtained by complementary drive of the filters, for example the signals allowed to pass by one filter are blocked by the other filter.

An add-drop function can also be realized, whereby the first means for spatial separation of the wavelengths of the programmable filter is blanked out by the absorption modulator, switch or optical amplifier of the filter allocated to the appertaining wavelength, and this wavelength or a different wavelength is again added following this modulator switch or amplifier, for example before or after the second means for combining the wavelengths of the filter.

An add-drop multiplexer wherein the add-drop function is realized with a type of cross-connect can be obtained by an optical circuit having two programmable optical filters, each having a respective optical input for supplying a plurality of optical wavelengths and each having a respective output for the output of the wavelength selectively allowed to pass by the filter, wherein the inputs of the two filters are optically connected to one another and whereby a selectible, optical wavelength can be selectively supplied to the output of one of the two filters. This selectible optical wavelength can be generated by a separate optical transmitter. The wavelength emerging from the output of the other of the two filters can also be supplied to a photodetector.

A tunable receiver, that implements the wavelength-division demultiplexing and time-division multiplexing, can be obtained with a programmable optical filter, particularly a filter of the present invention. Such a receiver is an optical circuit having a programmable optical filter having at least one input for supplying a plurality of optical wavelengths and having at least one output for the output the filter allows to pass and a photodetector to which the wavelength emerging from the output of the filter is connected. A time division multiplex can be selected from the selected wavelength channel by electrical drive of an absorption modulator, switch or amplifier of the filter with a time-division multiplexing signal.

An expanded optical cross-connect can be obtained with an optical circuit arrangement wherein the optical first means is provided for the spatial separation of a plurality of optical wavelengths that are to be supplied to a plurality of inputs of the first means, wherein the first means comprises a plurality of outputs for the outputs of the spatially separated wavelengths that is equal in number to the product of the plurality of inputs and the plurality of wavelengths and is fashioned so that each of the wavelengths which is supplied to all inputs is transmitted to a plurality of outputs corresponding to the number of the plurality of these inputs and that the wavelengths differing from one another which are supplied to all inputs are transmitted onto outputs differing from one another, a plurality of optical space switch matrices comprising the number of the plurality of wavelengths is provided, each having a respective plurality of inputs which is equal in number to the plurality of inputs of the first means for the spatial separation of the wavelengths and each having a specific plurality of outputs, whereby each space-switching matrix is fashioned so that each input of this matrix can be connected to each desirable output of this matrix and whereby each input of each space-switching matrix is connected to a respective output of the first means for spatial separation of the wavelengths that is allocated only to this input and second means for combining wavelengths emerging from all outputs of the space-switching matrix onto a plurality of outputs that correspond in number to the plurality of outputs of each and every space-switching matrix that are allocated in common to all space-switching matrices, wherein the second means for combining comprises a plurality of inputs corresponding in number to the product of the plurality of space-switching matrices and the plurality of outputs of each and every space-switching matrix, each of said inputs being connected to only one space-switching matrix by an output of this matrix that is allocated only to this input.

Given this circuit arrangement, a space-switching matrix arrangement composed of a plurality of space-switching matrices is arranged between the first means for the spatial separation of the optical wavelengths and the second means for combining the optical wavelengths, wherein each space-switching matrix can be realized, for example, with directional couplers or power dividers and optical amplifiers or interferometers. The signals belonging to the specific wavelengths at a plurality L of inputs of the first means for spatial separation of wavelengths are supplied onto the inputs of the switching matrix corresponding to this wavelength. The signals are supplied from the outputs of each and every switching matrix to a plurality L' of outputs of the second means for combining the wavelengths, wherein the allocation is determined by the position of the appertaining switching matrix. Wavelength channels can also be detected. For example, a port of the switching matrix that is not being employed at the moment for transmission through the filter can be employed as a photodetector in order to realize a drop function with little outlay. In case of an output of the switching arrangement is not being employed, a port of a switching matrix can be permanently connected to a photodetector in order to realize the drop function.

The selection of the structure for the circuit arrangement can occur dependent on the objective. A switching arrangement for few lines, for example only two lines, can be advantageously realized with power dividers, since the level loss due to power division is not especially high. When channels are to be exchanged between more than two lines, the circuit arrangement listed above is advantageous.

The circuit arrangement listed above can also be interpreted or operated as a programmable filter.

Dependent on the system of materials selected, all switch and circuit arrangements can be at least partially monolithically integrated on a common substrate. For example, demultiplexers according to the phased array principle and switches according to the Mach-Zehnder interferometer principle can be advantageously manufactured on a common substrate with organic polymers or III/V composite semiconductors, since they require extremely similar waveguide structures. Optimal amplifiers and modulators or interferometers can also be integrated on the substrate, for example in line form. Tapers for adaptation of the optical field are useful at the input and output of monolithically integrated structures.

Other advantages and features of the invention will be readily apparent from the following description of the preferred embodiments, the drawings and claims.

BRIEF DESCRIPTION OF THE DRAWINGS

FIG. 1 is a schematic illustration of an embodiment of a programmable optical filter in accordance with the present invention;

FIG. 2 is a cross sectional view through a plurality of optically-coupled optical amplifiers for a programmable optical filter;

FIG. 6 is a schematic illustration of an optical cross-connect realized with optical space-switching matrices and having more than two inputs and more than two outputs.

DESCRIPTION OF THE PREFERRED EMBODIMENTS

Figure 3:
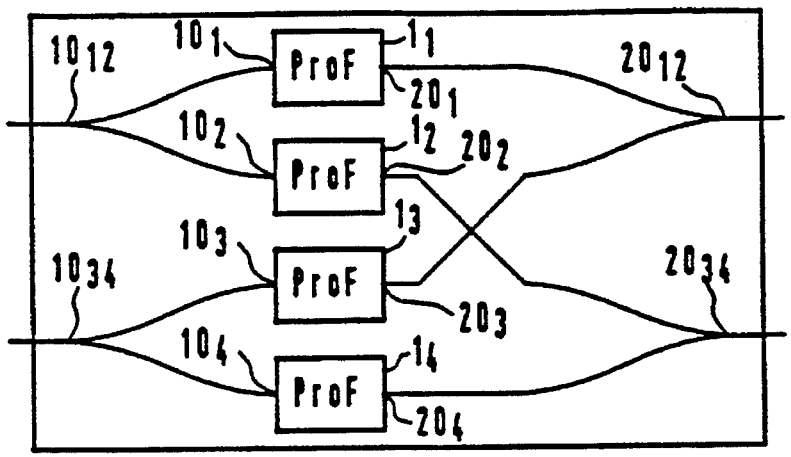
FIG. 3 is a schematic illustration of an optical cross-connect realized with a programmable optical filter, wherein optical power dividers are employed.

The principles of the present invention are particularly useful in a programmable optical filter, generally indicated at 1 in FIG. 1.

The programmable optical filter 1 for a plurality of different optical wavelengths $\lambda_1, \lambda_2, \ldots \lambda_K$ (K is an arbitrarily prescribable, natural number and in FIG. 1, K=4) comprises first means 11 for the spatial separation of these wavelengths $\lambda_1, \lambda_2, \ldots \lambda_K$ from one another that are supplied via an input 10. At its output side, the means 11 comprises K outputs (not shown), each of these being provided for the output of one of the wavelengths $\lambda_1, \lambda_2, \ldots \lambda_K$. For example, the means 11 can be composed of a planar, optical spectrograph.

Each wavelength $\lambda_i$ (i=1,2, ... K) is inventively supplied to electrically or optically controlled modulator means $2_i$, which may be either an optical absorption modulator or optical switch and is allocated only to one of these wavelengths $\lambda_i$. A switch $2_i$ can be composed of an optical directional coupler or of a phase modulator or amplifier in an interferometer, for example of the Mach-Zehnder type.

An absorption modulator or optical switch $2_i$ has the advantage that it can switch polarization-independently and rapidly.

The appertaining wavelength $\lambda_i$ is allowed to pass or is blocked dependent on the switch status of the absorption modulator or optical switch $2_i$. The absorption modulators or switches $2_i$ can be switched or changed independently of one another, so that a programmable optical filter is present.

The switch status of each and every absorption modulator or, respectively, optical switch $2_i$ is controlled by varying an optical refractive index by influencing the distribution of the electrical charge carriers by applying an electrical voltage, injecting an electrical current or injecting light, for example parallel or perpendicularly to the propagation direction of the light of the appertaining wavelength.

Each modulator or optical switch $2_i$ comprises an output that is connected to a respective input of the second means 12 that serves the purpose of combining the wavelengths $\lambda_i$ emerging spatially separately from one another from the modulators or switches $2_i$ into an output 20 of the second means 12. The wavelengths that the modulators or switches have respectively allowed to pass emerge at this output 20.

A complete, programmable optical filter is realized with the component parts set forth above.

It can be expedient, particularly for regulating levels, to provide a controllable optical amplifier $3_i$ for each wavelength $\lambda_i$ emerging from an output of the first means 11 for the controlled amplification of the light, which is either being supplied to the modulator or switch $2_i$ or emerging from this modulator or switch $2_i$, with the light having the wavelength $\lambda_i$ allocated to this modulator or switches $2_i$. Such optical amplifiers $3_i$ are arranged between the first means 11 and the modulators or switches $2_i$ in FIG. 1.

It can be especially expedient when a modulator or switch $2_i$ or an optical amplifier $3_i$ as well is fashioned so that, given temporary non-employment for the transmission of the light of the allocated wavelength $\lambda_i$, the non-used switch $2_i$ is connected to a photodetector for detecting the light having this allocated wavelength $\lambda_i$ or is used as such a photodetector. This embodiment is advantageous for an add-drop function.

It is also advantageous when the optical amplifiers $3_i$ are implemented optically coupled. To this end, the optical amplifiers $3_i$ according to FIG. 2 comprise a common sheet or layer waveguide 30 integrated on a substrate 100 and each amplifier $3_i$ comprises a separate electrode $31_i$ provided at a flat side of the sheet waveguide 30 for the independent, local control of the optical gain of the light guided in the sheet waveguide 30 by local injection of charge carriers into the sheet waveguide 30.

This embodiment is not limited to the filter of the invention but can also be applied to the known, programmable optical filter having only optical amplifiers that was set forth in greater detail at the outset.

A pn-junction or pin-junction is expediently provided under every electrode $31_i$ of an amplifier $3_i$ in the arrangement of FIG. 2.

In the embodiment of FIG. 2, the sheet waveguide 30 comprises a waveguiding layer 32 and a cladding layer 33 that is arranged between the electrodes $31_i$ and the waveguiding layer 32 and adjoins the wave-guiding layer 32. This cladding layer 33 has a refractive index $n_3$ that is lower in comparison to a refractive index $n_1$ of the wave-guiding layer 32. Moreover, a strip-like region $34_i$, which has a refractive index $n_2$ that is higher than the refractive index $n_3$ Of the cladding layer 33 and preferably at most equal to the refractive $n_1$ of the wave-guiding layer 32, is arranged in the cladding layer 33 adjacent the wave-guiding layer 32 under each and every strip-like electrode $31_i$.

The longitudinal direction of the strip-like electrodes $31_i$ and of the strip-like regions $34_i$ resides or extends perpendicularly relative to the plane of the drawing in FIG. 2 and the light, which is guided in the wave-guiding layer 32, likewise propagates perpendicularly relative to the plane of the drawing. Thus, the strip-like regions $34_i$ extend along the direction of propagating of the light in the layer 32.

In the embodiment of FIG. 2, for example, the metallic, strip-like electrodes $31_i$ are arranged on strip-like regions $35_i$ of p-doped InGaAs that are applied onto the cladding layer 33 of p-doped InP. The strip-like regions $34_i$ are composed of p-doped InGaAsP having a bandgap wavelength of 7.3 μm. The wave-guiding layer 32 is composed of InGaAsP having a bandgap wavelength of 7.55 μm. The substrate 100 is composed of n doped InP and has a metal contact 36 at its underside for n-doping. The metal contact 36 is grounded, for example, during operation and control signals are supplied to the electrodes $31_i$.

The cross-connect of the invention shown in FIG. 3 comprises four programmable optical filters $1_1, 1_2, 1_3$ and $1_4$, preferably of the invention, each respectively having an optical input $10_1, 10_2, 10_3$ and $10_4$, respectively, for supplying a plurality of optical wavelengths $\lambda_1, \lambda_2, \ldots \lambda_K$ and each respectively having an output $20_1, 20_2, 20_3$ and $20_4$, respectively, for the exit of the wavelengths that have been selectively allowed to pass by the filters $1_1, 1_2, 1_3,$ or $1_4$. The inputs $10_1$ and $10_2$ of a first pair of filters $1_1$, and $1_1$ and the inputs $10_3$ and $10_4$ of the second pair of filters $1_3$ and $1_4$ are optically connected to one another by optical power dividers $10_{12}$ and $10_{34}$, respectively, which dividers are waveguide forks, for example. The output $20_1$ of the filter $1_1$ of the first pair is optically connected to the output $20_3$ of the filter $1_3$ of the second pair by an optical power divider $20_{12}$, for example a waveguide fork, operated in the opposite direction. The output $20_2$ of the other filter $1_2$ of the first pair is optically connected to the output $20_4$, 0f the other filter $1_4$ of the second pair by a power divider $20_{34}$, for example, a waveguide fork, that is oppositely operated. The cross-connect function is obtained in that the filters $1_2$ and $1_4$ are driven complementary relative to the filters $1_1$ and $1_3$, i.e. the wavelengths the filters $1_1$ and $1_3$ allow to pass are blocked by the filters $1_2$ and $1_4$ and vice versa.

Figure 4:
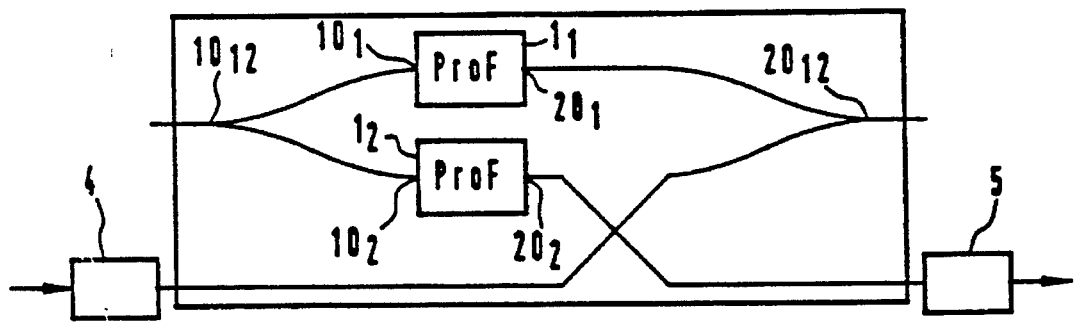
FIG. 4 is a schematic illustration of an add-drop multiplexer realized with a programmable filter in accordance with the present invention.

An add-drop multiplexer is shown in FIG. 4 and comprises programmable optical filters $1_1$ and $1_2$, preferably of the invention. Each filter $1_1$ and $1_2$ has an optical input $10_1$ or, respectively, $10_2$ for supplying a plurality of optical wavelengths $\lambda_1, \lambda_2, \ldots \lambda_K$ and each filter has an output $20_1$ or, respectively, $20_2$ for the output of the wavelengths selectively allowed to pass by the respective filter $1_1$ or $1_2$. The inputs $10_1$ and $10_2$ of the two filters $1_1$ and $1_2$ are optically connected to one another by an optical power divider $10_{12}$, for example an optical waveguide fork. A selectible, optical wavelength that, for example, can be generated by a tunable laser 4 can be selectively supplied to the output $20_1$ of the filter $1_1$. The supply ensues, for example, by an optical power divider $20_{12}$, for example an optical waveguide fork, that is oppositely driven. The wavelengths emerging from the output $20_2$ of the other filter $1_2$ are supplied to a photodetector 5, for example via an optical waveguide.

Figure 5:
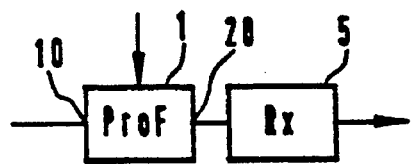
FIG. 5 is a schematic illustration of a tunable optical receiver realized with a programmable filter in accordance with the present invention.

The inventive, tunable optical receiver of FIG. 5 comprises a programmable optical filter 1, preferably of the invention, having at least one input 10 for supplying a plurality of optical wavelengths $\lambda_1, \lambda_2, \ldots \lambda_K$ and one output 20 for the exit of the wavelengths the filter 1 allows to pass and also comprises a photodetector 5 to which the wavelengths emerging from the output 20 of the filter 1 are conducted. A time-division multiplex channel can thus be selected from the selected wavelength channel by electrically driving the absorption modulator, switch or, respectively, optical amplifier of the filter with a time-division demultiplexing signal.

An optical means 110 for the spatial separation of a plurality K of optical wavelengths $\lambda_1, \lambda_2, \ldots \lambda_K$ that are to be supplied to a plurality L of inputs $110_1, 110_2, 110_3, 110_L$ of the means 110 is provided in the inventive multiplex cross-connect of FIG. 6. The means 110 comprises a plurality L·K of outputs for the output of the spatially separated wavelengths that corresponds to the product L·K of the plurality L of inputs $110_1, 110_2, \ldots 110_L$ and the plurality K of wavelengths $\lambda_1, \lambda_2, \ldots \lambda_K$. The plurality L·K of outputs is fashioned so that each of the wavelengths $\lambda_1, \lambda_2, \ldots \lambda_K$ that is supplied to all inputs $110_1, 110_2, 110_L$ is transmitted to a plurality L of outputs corresponding in number to the plurality L of these inputs, and so that wavelengths differing from one another, which are supplied to all inputs, are transmitted to outputs that differ from one another. A plurality K of optical space-switching matrices $130_1, 130_2, \ldots 130_K$. which correspond in number to the plurality K of wavelengths $\lambda_1, \lambda_2, \ldots \lambda_K$ are provided. Each matrix $130_1, 130_2, \ldots 130_K$ has a respective plurality L of inputs $130_{11}, 130_{12}, \ldots 130_{1L}; 130_{21}, 130_{22}, \ldots 130_{2L} \ldots$; and $130_{K1}, 130_{K2}, \ldots 130_{KL}$, respectively, that is equal to the plurality L of inputs of the means 110. Each matrix has a specific plurality L' of outputs $130'_{11}, 130'_{12}, \ldots 130'_{1L}; 130'_{21}, 130'_{22}, \ldots 130'_{2L} \ldots$; and $130'_{K1}, 130'_{K2}, \ldots 130'_{KL}$. Each space-switching matrix is fashioned so that every input of this matrix can be connected to any desired output of this matrix, and so that each input of each space-switching matrix is connected to a respective output of the first means 110 that is allocated only to this input.

Second means 120 is also provided for combining wavelengths emerging from all outputs of the space-switching matrices $130_1, 130_2, \ldots 130_K$ into a plurality L' of outputs $120'_1, 120'_2, \ldots 120'_L$ that corresponds in number to the plurality L' of the outputs of each and every space-switching matrix and that are allocated in common to all space-switching matrices $130_1, 130_2, \ldots 130_K$. This second means 120 comprises a plurality of inputs $120_{11}, 120_{12}2, 120_{1L}; 120_{21}, 120_{22}, \ldots 120_{2L}$; and $120_{K1}, 120_{K2}, \ldots 120_{KL}$, corresponding in number to the product L'·K of the plurality K of space-switching matrices and the plurality L' of outputs of each and every space-switching matrix. Each of the inputs is connected to only one space-switching matrix by an output of this matrix that is allocated only to this input.

For example, an optical space-switching matrix can be realized with optical directional couplers or power dividers and optical amplifiers or switches in the form of interferometers. Wavelength channels can also be detected when, for example, a port of the switching matrix which is not being used at the moment for transmission is operated as photodetector, as a result whereof a drop function is realized with little outlay. When an output of the cross-connect is not being employed, a port of the appertaining switching matrix can be permanently connected to a photodetector in order to realize the drop function. The cross-connect of FIG. 6 is advantageous when channels are exchanged between more than two lines.

Although various minor modifications may be suggested by those versed in the art, it should be understood that I wish to embody within the scope of the patent granted hereon all such modifications as reasonably and properly come within the scope of my contribution to the art.

I claim:

1. In a programmable optical filter for a plurality of different light optical wavelengths, said filter having first means for spatial separation of the wavelengths from one another and control means for each wavelength for controlling an influence of the light of said wavelength independent of the other wavelengths, the improvements comprising said control means being composed of modulator means for absorption modulation and optical switching.

2. In a programmable optical filter according to claim 1, wherein the modulator means is an optical switch composed of an optical directional coupler.

3. In a programmable optical filter according to claim 1, wherein the modulator means is an optical switch composed of an interferometer.

4. In a programmable optical filter according to claim 1, which includes a controllable optical amplifier being assigned with each of the modulator means for amplifying the light passing through the respective modulator means.

5. In a programmable optical filter according to claim 4, wherein the optical amplifier is arranged between the modulator means and the first means for spatial separation of the wavelengths from one another so that the amplifier means acts on the light prior to passing through the modulator means.

6. In a programmable optical filter according to claim 1, wherein each of the modulator means can be switched into a transmission status, wherein the light having the wavelength supplied to the particular modulator means is transmitted and the modulator means can be switched into a blocking status wherein the modulator means is non-transmissive for the light being submitted thereto.

7. In a programmable optical filter according to claim 1, which has a modulator means and a photodetector for detecting said light.

8. In a programmable optical filter according to claim 7, wherein said photodetector is included in said modulator means.

9. In a programmable optical filter according to claim 1, which includes means for combining wavelengths emerging spatially separated from one another from the modulator means.

10. In a programmable optical filter for a plurality of different wavelengths comprising first means for spatial separation of the wavelengths from one another, amplifier means for each of the wavelengths for controlled influencing of the light of said wavelengths independent of other wavelengths, said amplifier means being constructed in the form of strip-like optical waveguides integrated on a substrate wherein a guided light can be optically intensified by injection of electrical charge carriers, control means for each wavelength for controlling the influence of light of said wavelength independent of the other wavelengths, the improvement comprises said amplifier means comprising a common sheet waveguide integrated on a substrate, each amplifier means comprising a separate strip-like electrode provided on a flat side of said sheet waveguide for independent, local control of the optical amplification of light guided in the sheet waveguide by locally influencing the distribution of the electrical charge carriers in the sheet waveguide.

11. In a programmable optical filter according to claim 10, wherein a junction between each electrode of the amplifier means and the sheet waveguide is selected to be from a group consisting of pn-junctions and pin-junctions.

12. In a programmable optical filter according to claim 10, wherein the sheet waveguide comprises a wave-guiding layer and a cladding layer, with the cladding layer separating the electrodes from the wave-guiding layer, said cladding layer having an index of refraction lower in comparison to the index of refraction of the wave-guiding layer.

13. In a programmable optical filter according to claim 12, wherein said cladding layer having strip-shaped regions having an index of refraction higher than the index of refraction of the cladding layer being positioned adjacent the wave-guiding layer under each of the strip-like electrodes.

14. In a programmable optical filter according to claim 13, wherein the index of refraction of the strip-like regions is at most equal to the index of refraction of the wave-guiding layer.

15. In a programmable optical filter according to claim 10, wherein the programmable optical filter has at least one output for the output of the wavelength of the filter, said output being connected to a photodetector to which a wavelength emerging from the output of the filter is conducted.

16. An optical circuit arrangement comprising two programmable optical filters, each having respective optical inputs for supplying a plurality of optical waveguides and each having a respective output for the output of the wavelengths selectively allowed to pass by the filter, each of the two filters having inputs optically connected to one another, and means for applying a selective optical wavelength to an output of one of the two filters.

17. An optical circuit arrangement according to claim 16, wherein the means for selectively supplying a selected optical wavelength includes a separate optical transmitter means for generating said selected optical wavelength.

18. An optical circuit arrangement according to claim 16, wherein a wavelength emerging from an output of the other of the two filters being supplied to a photodetector.

19. An optical circuit arrangement comprising four programmable optical filters, each having respective optical inputs for supplying a plurality of optical wavelengths and each having a respective output for the output of the wavelengths selectively allowed to pass by the filter, said four programmable filters being arranged in pairs with the inputs of the first pair and the inputs of the second pair of the four filters being respectively optically connected to one another and the output of one filter of the first pair and one filter of the second pair being connected together and the output of the other filter of the first pair and the other filter of the second pair being connected together.

20. An optical circuit arrangement comprising optical first means being provided for the spatial separation of a plurality of optical wavelengths that are to be supplied to a plurality of inputs of the optical first means, said optical first means comprising a plurality of outputs for the output of the spatially separated wavelengths with the number of outputs being equal to the number of the product of the plurality of inputs and the plurality of wavelengths with the outputs being constructed so that each of the wavelengths which is supplied to all inputs is transmitted to a plurality of outputs corresponding in number to the plurality of these inputs and so that the wavelengths differ from one another which are supplied to all inputs and are transmitted into outputs differing from one another, a plurality of optical space-switching matrices corresponding in number to the plurality of wavelengths being provided, each matrix having a respective plurality of inputs which is equal to the number of plurality of inputs of the optical first means for the spatial separation of the wavelengths, and each matrix having a specific plurality of outputs, each space-switching matrix being fashioned so that each input of said matrix can be connected to each desired output of said matrix and wherein each input of each space-switching matrix is connected to a respective output of the optical first means for spatial separation of the wavelengths that are allocated only to said input and second means for combining wavelengths emerging from all outputs of the space-switching matrix into a plurality of outputs that correspond in number to the plurality of outputs of each and every space-switching matrix and that are allocated in common to all space-switching matrices so that the second means for combining comprises a plurality of inputs corresponding in number to the product of the plurality of space-switching matrices and the plurality of outputs of each and every space-switching matrix, each of said inputs of the second means being connected to only one space-switching matrix by an output of said matrix that is allocated only to said input.

* * * * *